United States Patent
Higashida et al.

(10) Patent No.: US 10,032,974 B2
(45) Date of Patent: Jul. 24, 2018

(54) THERMOELECTRIC CONVERSION MODULE AND THERMOELECTRIC CONVERSION APPARATUS

(71) Applicant: Panasonic Corporation, Osaka (JP)

(72) Inventors: Takaaki Higashida, Osaka (JP); Kaori Toyoda, Hyogo (JP); Yoshihisa Ohido, Osaka (JP); Takashi Kubo, Osaka (JP); Satoshi Maeshima, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 377 days.

(21) Appl. No.: 13/786,601

(22) Filed: Mar. 6, 2013

(65) Prior Publication Data

US 2013/0233369 A1  Sep. 12, 2013

(30) Foreign Application Priority Data

Mar. 7, 2012 (JP) .................................. 2012-050035
Jan. 10, 2013 (JP) .................................. 2013-002555

(51) Int. Cl.
  *H01L 35/30* (2006.01)
  *H01L 35/32* (2006.01)
(52) U.S. Cl.
  CPC ................... *H01L 35/32* (2013.01)
(58) Field of Classification Search
  CPC ........................................... H01L 35/32
  USPC ................... 136/228, 208; 62/3.3
  See application file for complete search history.

(56) References Cited

U.S. PATENT DOCUMENTS

| 4,732,619 | A | 3/1988 | Nanigian |
| 5,952,728 | A | 9/1999 | Imanishi et al. |
| 6,096,966 | A | 8/2000 | Nishimoto et al. |
| 6,096,968 | A | 8/2000 | Schlosser et al. |
| 6,306,673 | B1 | 10/2001 | Imanishi et al. |
| 6,598,405 | B2 | 7/2003 | Bell |
| 8,552,284 | B2 | 10/2013 | Kanno et al. |
| 2002/0148235 | A1* | 10/2002 | Bell ............................ 62/3.3 |
| 2006/0032526 | A1 | 2/2006 | Fukutani et al. |

(Continued)

FOREIGN PATENT DOCUMENTS

| CN | 102232153 A | 11/2011 |
| JP | 62-281776 A | 12/1987 |

(Continued)

OTHER PUBLICATIONS

Chinese Search Report for Application No. 201310070535.1 dated Apr. 30, 2015.

*Primary Examiner* — Matthew T Martin
*Assistant Examiner* — Dujuan A Horton
(74) *Attorney, Agent, or Firm* — Pearne & Gordon LLP (57) ABSTRACT

A thermoelectric conversion module and a thermoelectric conversion apparatus in which a thermoelectric conversion element can be flexibly attached to heat sources having various shapes in high density are provided. The thermoelectric conversion module includes a first thermoelectric conversion element configured of a cylindrical thermoelectric conversion material having a hollow portion and a second thermoelectric conversion element configured of a thermoelectric conversion material having a different conductive type from that of the first thermoelectric conversion element and fixed in the hollow portion.

7 Claims, 8 Drawing Sheets

(56) References Cited

U.S. PATENT DOCUMENTS

| | | |
|---|---|---|
| 2006/0101829 A1 | 5/2006 | Morand |
| 2009/0133734 A1 | 5/2009 | Takahashi |
| 2012/0000737 A1 | 1/2012 | Horio |
| 2013/0068273 A1* | 3/2013 | Kanno et al. ................. 136/224 |

FOREIGN PATENT DOCUMENTS

| | | |
|---|---|---|
| JP | 06-097514 A | 4/1994 |
| JP | 09-199765 A | 7/1997 |
| JP | 2004-193526 A | 7/2004 |
| JP | 2004-526322 A | 8/2005 |
| WO | 02/081982 A1 | 10/2002 |
| WO | 2010/109592 A1 | 9/2010 |
| WO | 2012/014366 A1 | 2/2012 |
| WO | WO 2012014366 A1 * | 2/2012 |

* cited by examiner

THERMOELECTRIC CONVERSION MODULE AND THERMOELECTRIC CONVERSION APPARATUS

CROSS REFERENCE TO RELATED APPLICATIONS

This application is entitled and claims the benefit of Japanese Patent Application No. 2012-050035, filed on Mar. 7, 2012, and Japanese Patent Application No. 2013-002555, filed on Jan. 10, 2013, the disclosure of which including the specification, drawings and abstract is incorporated herein by reference in its entirety.

TECHNICAL FIELD

The present invention relates to a thermoelectric conversion module and a thermoelectric conversion apparatus.

BACKGROUND ART

From the past, there has been a thermoelectric conversion apparatus which converts heat into electricity using the Seebeck effect. In the thermoelectric conversion apparatus, a thermoelectric conversion material made of a semiconductor generating an electromotive force by giving a temperature gradient is used. As for the thermoelectric conversion material of the semiconductor, there are a p-type thermoelectric conversion material and an n-type thermoelectric conversion material depending on the difference of a conductive type. In the p-type thermoelectric conversion material and the n-type thermoelectric conversion material, when a temperature gradient direction is identical, an electromotive force direction is reversed.

Figure 9:
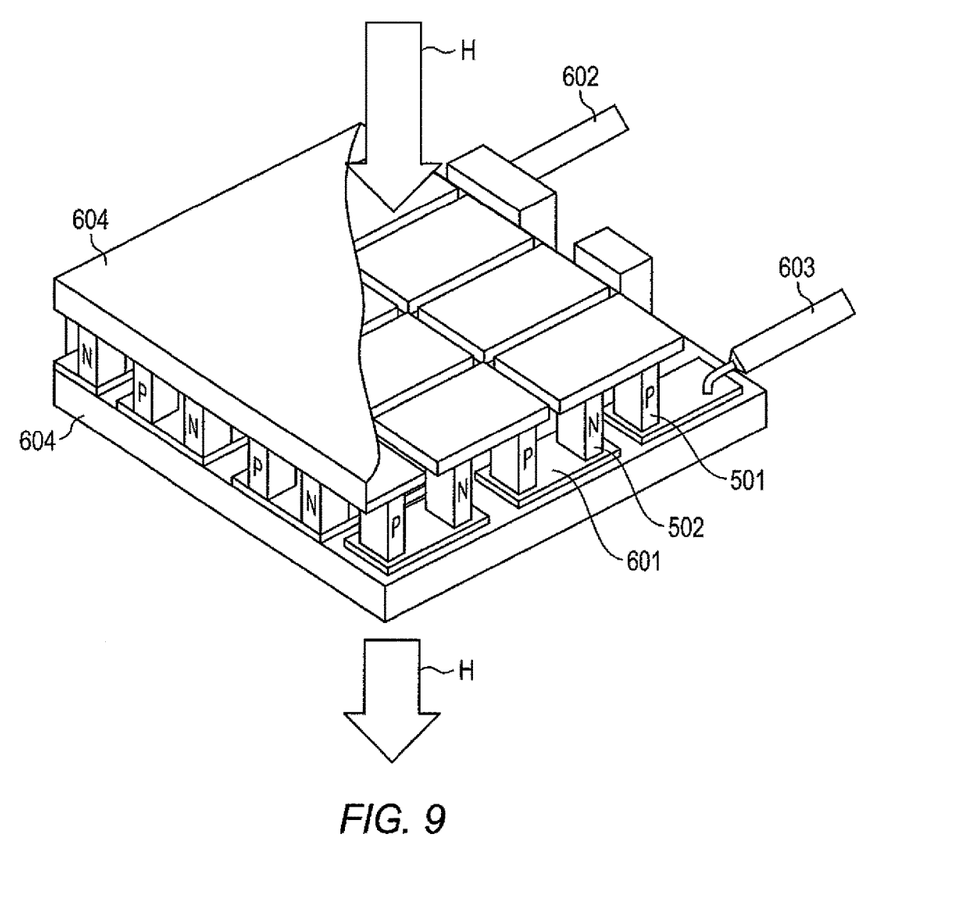
FIG. 9 is a configuration diagram showing an example of a thermoelectric conversion apparatus in the prior art.

FIG. 9 shows a general thermoelectric conversion apparatus in the prior art. The general thermoelectric conversion apparatus includes plural p-type thermoelectric conversion materials 501, plural n-type thermoelectric conversion materials 502 and plural electrodes 601 which are respectively electrically connected with two ends of p-type thermoelectric conversion material 501 and n-type thermoelectric conversion material 502 in each adjacent pair. Plural p-type thermoelectric conversion materials 501, plural n-type thermoelectric conversion materials 502 and plural electrodes 601 are covered and fixed by, for example, a ceramic substrate 604. Then, outer connection terminals 602 and 603 are connected with one end of the electrodes and the other end of the electrodes to output power.

In the prior art, it has been proposed to provide the thermoelectric conversion material in various shapes in the thermoelectric conversion apparatus.

For example, a configuration in which a p-type thermoelectric conversion material or an n-type thermoelectric conversion material is provided on an inner wall surface of a through hole of a porous heat-resistant insulator in a film shape is disclosed in PTL 1 (refer to FIG. 1 of PTL 1). In addition, a configuration in which the through hole where the p-type thermoelectric conversion material or the n-type thermoelectric conversion material is formed on the inner wall surface is formed in a circular truncated cone shape is disclosed in PTL 1 (refer to FIG. 3 of PTL 1).

In PTLs 2 and 3, a thermoelectric conversion module in which an n-type thermoelectric conversion material and a p-type thermoelectric conversion material are alternately inserted into a large number of through holes of a honeycomb structural body having flexibility is disclosed. In the thermoelectric conversion module, each end surface of the n-type thermoelectric conversion material and the p-type thermoelectric conversion material is connected through a metal piece.

CITATION LIST

Patent Literature

PTL 1
Japanese Patent Application Laid-Open NO. HEI 6-097514
PTL 2
Japanese Patent Application Laid-Open NO. HEI 9-199765
PTL 3
U.S. Pat. No. 5,952,728

SUMMARY OF INVENTION

Technical Problem

Since a general thermoelectric conversion apparatus in the prior art has a block-like or plate-like configuration without flexibility, the thermoelectric conversion apparatus cannot be flexibly attached to heat sources having various shapes. Moreover, when the thermoelectric conversion apparatus is divided into a small blocks and attached to heat sources having various shapes, for example, as in the case where plural small block-like heat source conversion apparatuses are attached to a heat source having a cylindrical shape, a problem arises in that the density of a thermoelectric conversion material in contact with the heat source is decreased and heat use efficiency is decreased.

An object of the present invention is to provide a thermoelectric conversion module and a thermoelectric conversion apparatus in which a thermoelectric conversion material can be arranged in high density and flexibly attached to heat sources having various shapes.

Solution to Problem

A thermoelectric conversion module according to an aspect of the present invention includes: a first thermoelectric conversion element configured of a cylindrical thermoelectric conversion material having a hollow portion, and a second thermoelectric conversion element configured of a thermoelectric conversion material having a different conductive type from that of the first thermoelectric conversion element and fixed in the hollow portion.

A thermoelectric conversion apparatus according to another aspect of the present invention includes: a plurality of the thermoelectric conversion modules, each of which is the thermoelectric conversion module, wherein the plurality of the thermoelectric conversion modules are coupled and electrically connected in a direction in which a plurality of the hollow portions are arranged in sequence.

Advantageous Effects of Invention

According to the present invention, it is possible to arrange a thermoelectric conversion material in high density and flexibly attach the thermoelectric conversion material to heat sources having various shapes.

BRIEF DESCRIPTION OF DRAWINGS

FIGS. 1A and 1B are diagrams showing a thermoelectric conversion element used in a thermoelectric conversion module according to an embodiment of the present invention, and FIG. 1A is a vertical cross-sectional view thereof and FIG. 1B is a plane view;

FIGS. 3A and 3B show the thermoelectric conversion module according to the embodiment of the present invention, and FIG. 3A is a vertical cross-sectional view and FIG. 3B is a plane view;

DESCRIPTION OF EMBODIMENTS

Now, each embodiment of the present invention will be described in detail with reference to the accompanying drawings.

Embodiment 1

Figure 1A:
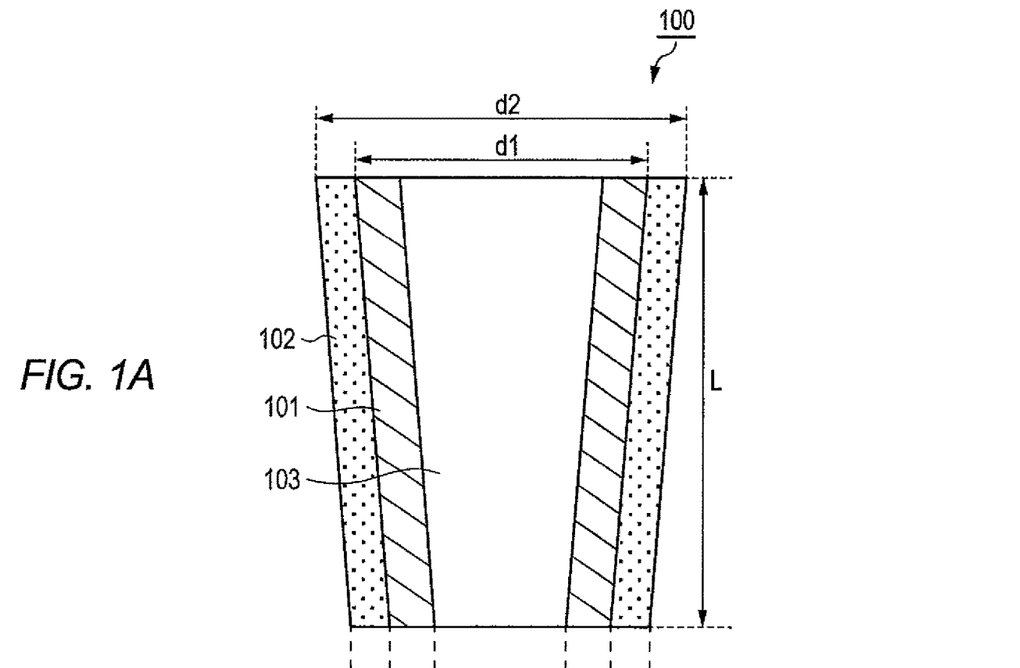
Figure 1B:
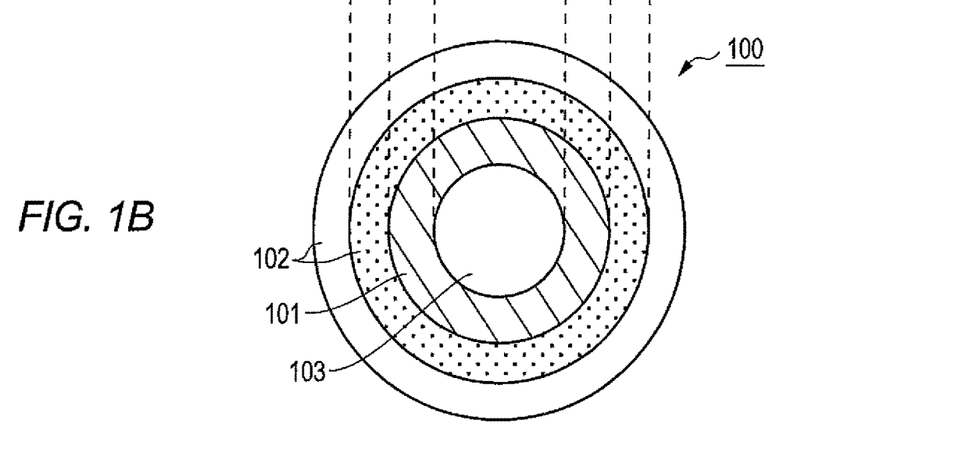

FIGS. 1A and 1B are diagrams showing a thermoelectric conversion element used in a thermoelectric conversion module according to Embodiment 1 of the present invention, and FIG. 1A is a vertical cross-sectional view thereof and FIG. 1B is a plan view.

[Thermoelectric Conversion Element]

First, thermoelectric conversion element 100 which is a component of the thermoelectric conversion module according to Embodiment 1 of the present invention will be described.

Thermoelectric conversion element 100 has a cylindrical configuration having hollow portion 103, and includes cylindrical heat-resistant insulating material 102 and cylindrical thermoelectric conversion material 101.

Thermoelectric conversion material 101, heat-resistant insulating material 102, and thermoelectric conversion element 100 are formed in a tapered cylindrical shapes. By having the tapered shape, manufacturing of the thermoelectric conversion module which will be described later becomes easy. However, when the ease of the manufacturing method is unnecessary, the taper may not be provided.

Heat-resistant insulating material 102 is a tubular material with a hollow and both ends are opened.

Heat-resistant insulating material 102 has heat-resistance in which a stable shape is maintained in the temperature of a high temperature portion at the time of element use and in a melting point of the thermoelectric conversion material.

In addition, heat-resistant insulating material 102 has insulation properties to block a current of thermoelectric conversion material 101 at the time of element use. Heat-resistant insulating material 102 may be enable to contain thermoelectric conversion material 101 and may have heat-resistance and insulation properties. It is preferable that heat-resistant insulating material 102 be cylindrical from the viewpoint of arranging the element in the module in high density. As for heat-resistant insulating material 102, for example, there may be metal oxides such as silica and alumina, heat-resistant glass and quartz. The material of heat-resistant insulating material 102 is preferably quartz from the viewpoint of heat-resistance, and is further preferably heat-resistant glass in consideration of cost.

In order to secure flexibility and high density properties when the heat-resistant insulating material is attached to the heat source, heat-resistant insulating material 102 preferably has a length of 1.0 to 3.0 mm in an axial direction, more preferably 1.0 to 2.0 mm, and further preferably 1.5 to 2.0 mm.

Furthermore, heat-resistant insulating material 102 can use a material having maximum inner diameter d1 and maximum external diameter d2 of, for example, 1.8 to 3.2 turn and 3 to 4.4 mm. When heat-resistant insulating material 102 with a large diameter and heat-resistant insulating material 102 with a small diameter are combined, thermoelectric conversion element 100 with a small diameter can be disposed in thermoelectric conversion element 100 with a large diameter.

Thermoelectric conversion material 101 is a p-type thermoelectric conversion material or an n-type thermoelectric conversion material.

As for thermoelectric conversion material 101, a material can be selected according to a difference in temperature generated at the time of use. As for thermoelectric conversion material 101, for example, when the difference in temperature at the time of use is from room temperature to 500 K, bismuth-tellurium based (Bi—Te based) materials can be employed. In addition, as for thermoelectric conversion material 101, when the difference in temperature at the time of use is from room temperature to 800 K, lead-tellurium based (Pb—Te based) materials can be employed, and when the difference in temperature at the time of use is from room temperature to 1000 K, silicon-germanium based (Si—Ge based) materials can be employed.

Moreover, the p-type thermoelectric conversion material and the n-type thermoelectric conversion material can be obtained by, for example, adding an appropriate dopant to the thermoelectric conversion material. As for a negative dopant to obtain the p-type thermoelectric conversion material, for example, there may be Sb. As for a dopant to obtain the n-type thermoelectric conversion material, for example, there may be Se. Due to the addition of these dopants, the thermoelectric conversion material forms a mixed crystal. Therefore, for example, these dopants are added to the thermoelectric conversion material by the amount represented by a composition formula of a thermoelectric conversion material such as "$Bi_{0.5}Sb_{1.5}Te_3$" or "$Bi_2Te_{2.7}Se_{0.3}$".

[Method for Manufacturing Thermoelectric Conversion Element]

Next, an example of a method for manufacturing the above-described thermoelectric conversion element will be described.

Figure 2:
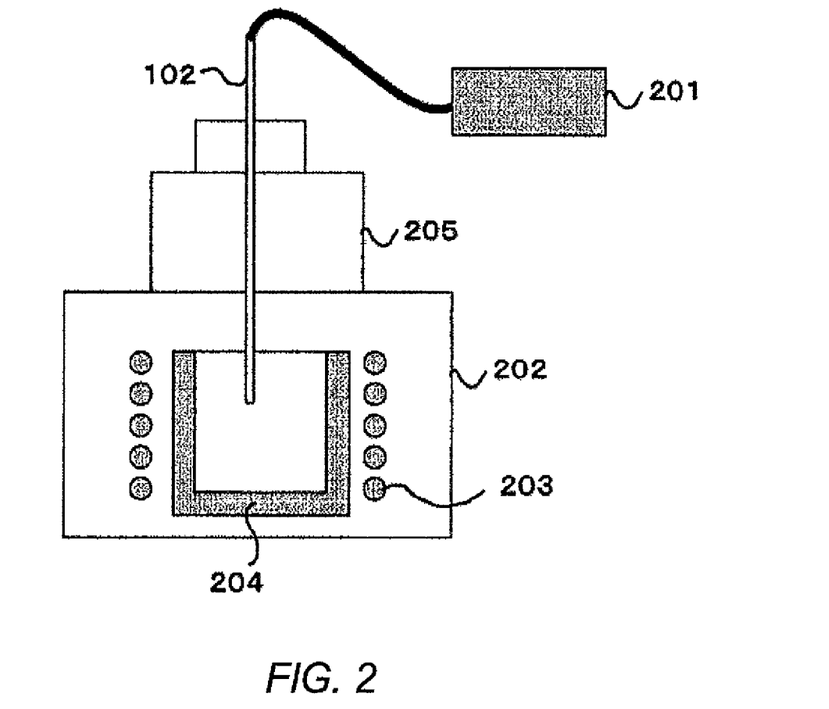
FIG. 2 is a diagram explaining an example of a method for manufacturing the thermoelectric conversion element in FIGS. 1A and 1B.

FIG. 2 is a diagram explaining an example of a method for manufacturing the thermoelectric conversion element in FIGS. 1A and 1B.

For manufacturing the thermoelectric conversion element, first, hollow cylindrical heat-resistant insulating material 102 is prepared. As for heat-resistant insulating material 102, glass, particularly, heat-resistant glass (one kind of borosilicate glass in which SiO2 and B2O3 are mixed, and a material having a thermal expansion coefficient of about 3×10−6/K) can be used. In the embodiment, heat-resistant insulating material 102 in which a total length L is 150 mm and inner diameter d1 and outer diameter d2 are respectively 1.8 mm and 3 mm is employed.

Next, one end of heat-resistant insulating material 102 is connected to decompressor 201 through a pipe. Then, crucible 204 in furnace 202 substituted in a non-oxygen atmosphere in advance is heated to a predetermined temperature and thermoelectric conversion material 101 is placed in a melting state. Specifically, thermoelectric conversion material 101 is inductively heated under the action of a magnetic field generated from coil 203, convection is generated due to a difference in temperature of an outer circumferential portion and an inner circumferential portion and a difference in temperature of an upper portion and a lower portion in melt so that the melt in crucible 204 is evenly stirred.

Subsequently, heat-resistant insulating material 102 is inserted from the upper portion of furnace 202 and is maintained in preheating region 205 maintained to a predetermined temperature for a predetermined time. Then, for heat-resistant insulating material 102, one end of heat-resistant insulating material 102 is immersed into crucible 204 and negative pressure is generated by decompressor 201 thereby introducing thermoelectric conversion material 101 which is melted in heat-resistant insulating material 102. In the embodiment, as for thermoelectric conversion material 101, a Bi2Te3 based material is employed.

When heat-resistant insulating material 102 is filled with thermoelectric conversion material 101, thermoelectric conversion material 101 is solidified according to the preheated temperature of heat-resistant insulating material 102 so that a crystal state is determined. When there is no flowage in thermoelectric conversion material 101, the solidification of thermoelectric conversion material 101 is determined only by the temperature of heat-resistant insulating material 102, and a preferred crystal growing direction is a direction perpendicular to an inner wall surface of heat-resistant insulating material 102.

However, when there is flowage in thermoelectric conversion material 101 during the solidification, a preferred crystal growing direction becomes a direction in which a cooling direction and a flowing direction are combined and a crystal structure oriented in this direction can be obtained.

The crystalline orientation direction has an influence on thermoelectric conversion properties of thermoelectric conversion material 101. Therefore, the crystalline orientation direction is controlled by controlling a suction rate and cooling rate of thermoelectric conversion material 101 and the thermoelectric conversion properties relating to the orientation direction can be controlled.

The temperature of thermoelectric conversion material 101 sucked through heat-resistant insulating material 102 increases as approaching the center portion of heat-resistant insulating material 102 and flowage is not repressed. Due to this, when the suction rate becomes fast, it is possible to obtain a configuration in which the center is hollow and thermoelectric conversion material is solidified in a film shape on the inner wall surface of the tube.

Then, the configuration is cut into a predetermined length so that the thermoelectric conversion element in FIGS. 1A and 1B is formed. The p-type thermoelectric conversion element is formed by using the p-type thermoelectric conversion material and the n-type thermoelectric conversion element is formed by using the n-type thermoelectric conversion material.

[Thermoelectric Conversion Module]

Figure 3A:
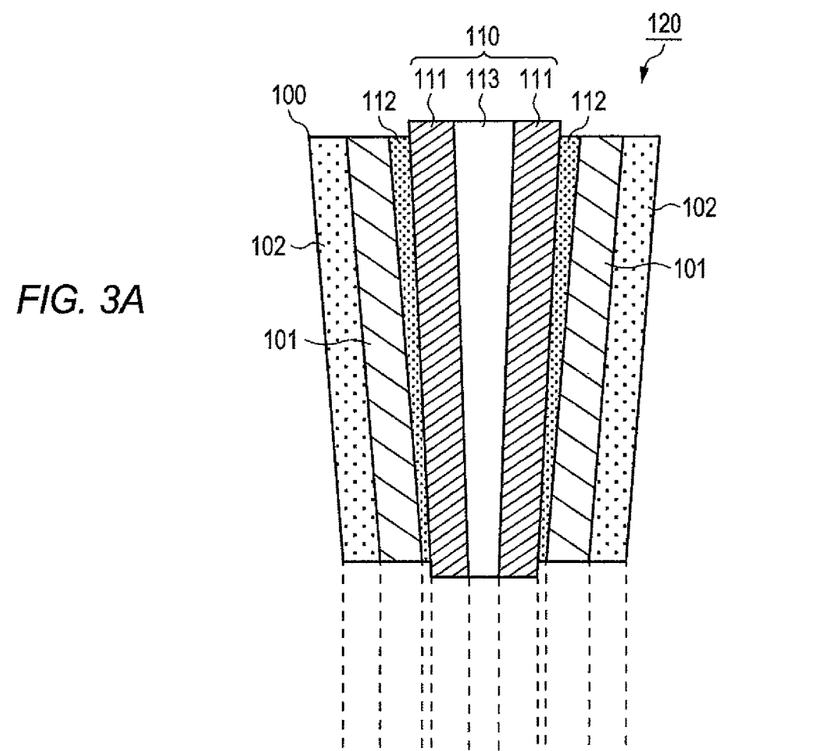
Figure 3B:
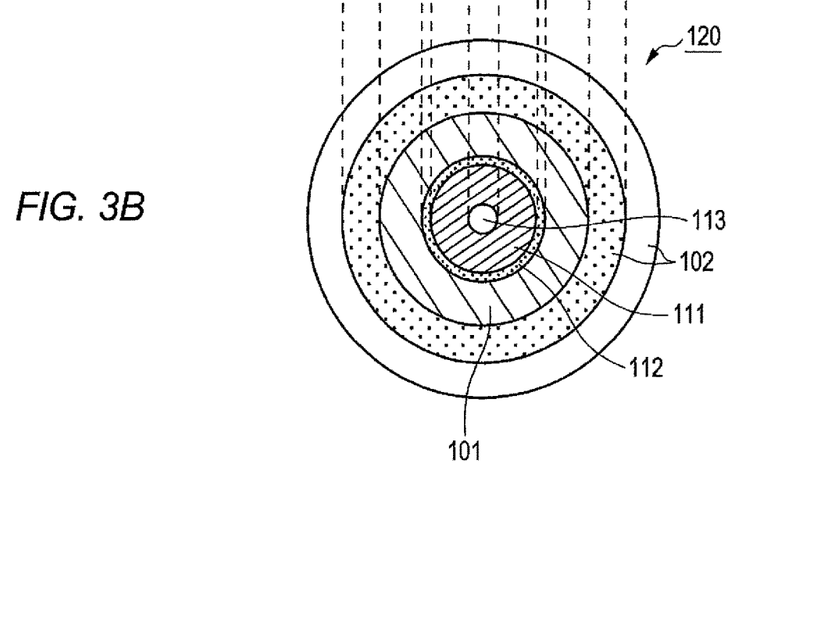

FIGS. 3A and 3B show the thermoelectric conversion module according to Embodiment 1 of the present invention, and FIG. 3A is a vertical cross-sectional view thereof and FIG. 3B is a plan view.

Thermoelectric conversion module 120 according to Embodiment 1 of the present invention includes the above-described thermoelectric conversion element 100 and thermoelectric conversion element 110 having a smaller diameter than that of thermoelectric conversion element 100. Thermoelectric conversion element 110 having a small diameter is disposed inside of thermoelectric conversion element 100. Since inside thermoelectric conversion element 110 is a cylindrical shape having hollow portion 113, the inside thermoelectric conversion element is configured with thermoelectric conversion material 111 in which an outer circumferential surface and an inner circumferential surface are tapered. For thermoelectric conversion material 111, for example, a thermoelectric conversion material made of a p-type semiconductor (referred to as a p-type thermoelectric conversion material) is used.

For example, after the p-type thermoelectric conversion material which has a tapered hollow cylindrical is formed using the manufacturing method described in FIG. 2., inside thermoelectric conversion element 110 can be manufactured by removing outside heat-resistant insulating material 102.

Inside thermoelectric conversion element 110 is fixed to hollow portion 103 of outside thermoelectric conversion element 100. While there is no particular limitation, one end and the other end of thermoelectric conversion element 110 having a small diameter in an axial direction are protruded from ends of outside thermoelectric conversion element 100 for easy wire connection.

In outside thermoelectric conversion element 100, as for thermoelectric conversion material 101, a thermoelectric conversion material made of an n-type semiconductor (referred to as an n-type thermoelectric conversion material) is used. For outside thermoelectric conversion element 100 and inside thermoelectric conversion element 110, the conductive types of thermoelectric conversion materials 101 and 111 may be different from each other such that a p-type thermoelectric conversion material may be used for outside thermoelectric conversion element 100 and an n-type thermoelectric conversion material may be used for inside thermoelectric conversion element 110.

Inside thermoelectric conversion element 110 is fixed to the inner wall surface of thermoelectric conversion element 100 through junction portion 112. Junction portion 112 is filled with a material having conductive properties or a material having insulation properties. When two thermoelectric conversion materials 101 and 111 are electrically connected in this portion, the material having conductive properties may be used and when an electrical connection does not need to be done in this portion, the material having insulation properties may be used.

Then, when two thermoelectric conversion elements 100 and 110 are joined only by physical contact, junction portion 112 to fix both thermoelectric conversion elements may be omitted.

In addition, when an electrical connection does not need to be done by junction portion 112, thermoelectric conversion element 110 disposed inside may have a configuration in which the periphery is covered by the heat-resistant insulating material as in outside thermoelectric conversion element 100.

Figure 4:
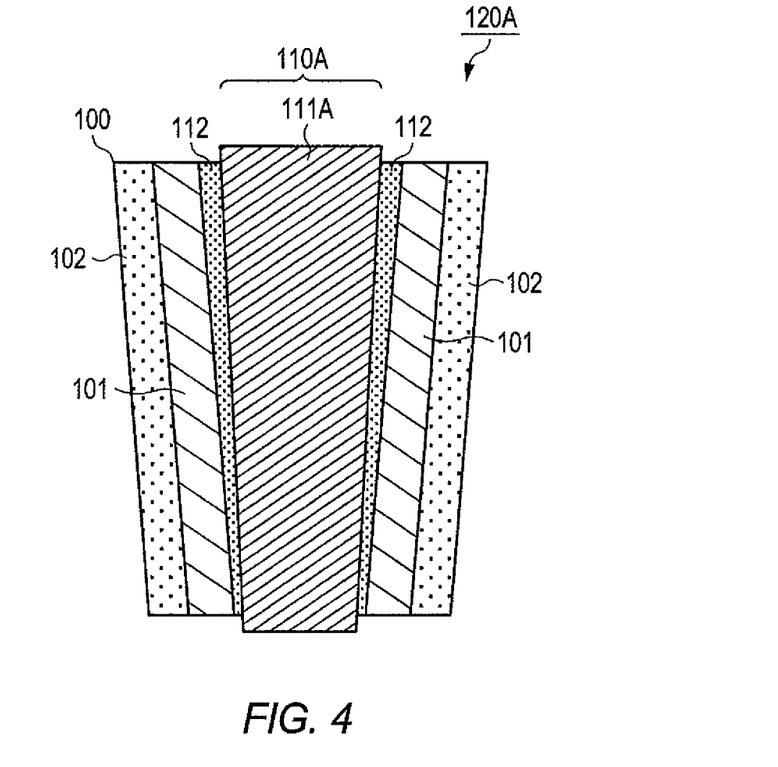
FIG. 4 is a vertical cross-sectional view showing a modification example of the thermoelectric conversion module according to the embodiment of the present invention.

FIG. 4 is a vertical cross-sectional view showing a modification example of the thermoelectric conversion module according to the embodiment of the present invention.

Moreover, as shown in thermoelectric conversion module 120A in FIG. 4, inside thermoelectric conversion element 110A can be configured with thermoelectric conversion material 111A having a circular truncated cone shape without hollow portion 113.

In thermoelectric conversion module 120 in FIGS. 3A and 3B, since inside thermoelectric conversion element 110 has hollow portion 113, it is possible to provide an electrode on the inner wall surface of thermoelectric conversion material 111. However, when the electrode is provided in the end of thermoelectric conversion material 111 in the axial direction, the thermoelectric conversion element may not have the hollow portion as shown in FIG. 4.

Thermoelectric Conversion Apparatus

Embodiment 1

Figure 5A:
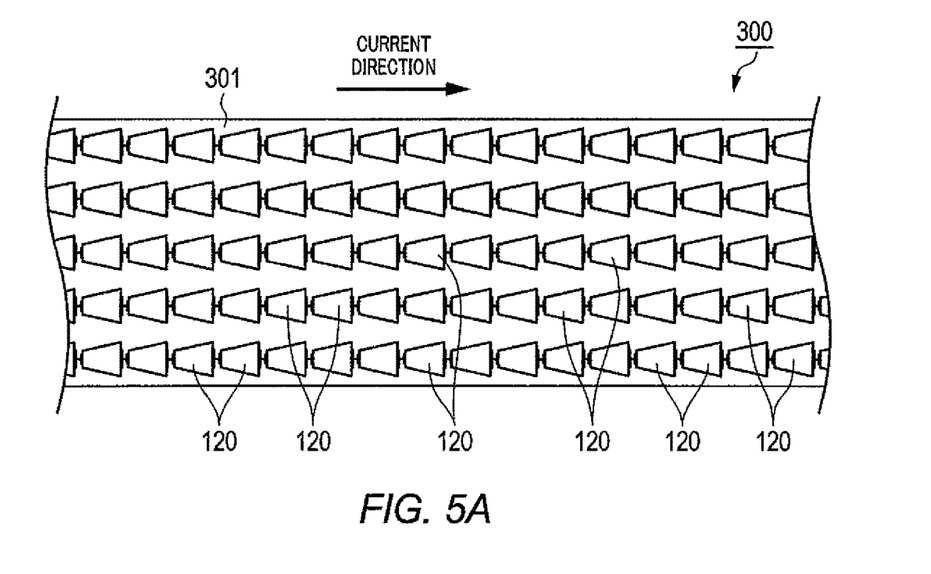
FIGS. 5A and 5B are diagrams showing a thermoelectric conversion apparatus according to Embodiment 1 of the present invention.
Figure 5B:
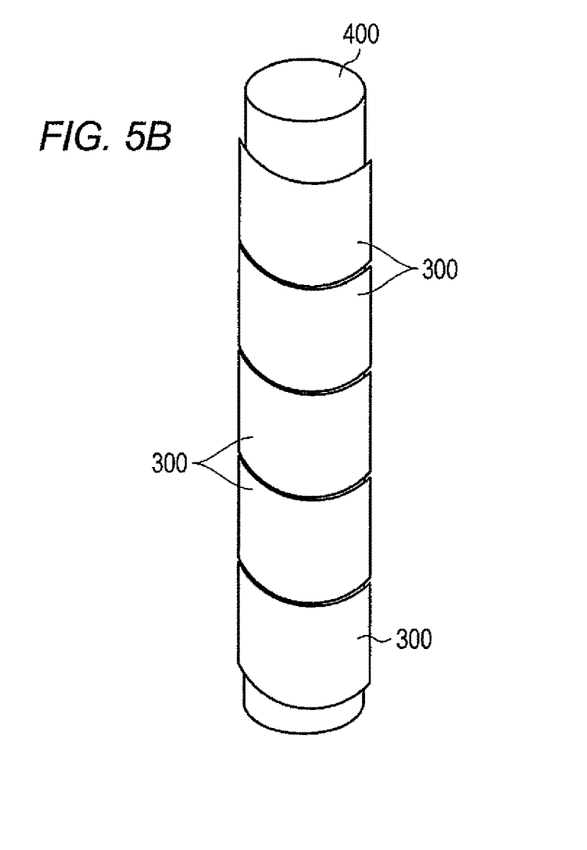

FIGS. 5A and 5B are diagrams showing a thermoelectric conversion apparatus according to Embodiment 1 of the present invention, and FIG. 5A is a plan view thereof and FIG. 5B is diagram explaining a state in which the thermoelectric conversion apparatuses are attached to a pipe of a heat source.

As shown in FIG. 5A, thermoelectric conversion apparatus 300 of Embodiment 1 has module trains in which plural thermoelectric conversion modules 120 are coupled in the axial direction. The axial direction refers a direction in which hollow portions 103 of thermoelectric conversion elements 100 continue. In addition, the coupling has flexibility.

Furthermore, in thermoelectric conversion apparatus 300, the above plural module trains arranged in parallel are fixed to belt body 301 having flexibility.

As shown in FIG. 5B, thermoelectric conversion apparatuses 300 of Embodiment 1 can be used such that the thermoelectric conversion apparatuses are spirally wrapped around a heat source such as a pipe 400.

[Electrode Configuration]

Figure 6:
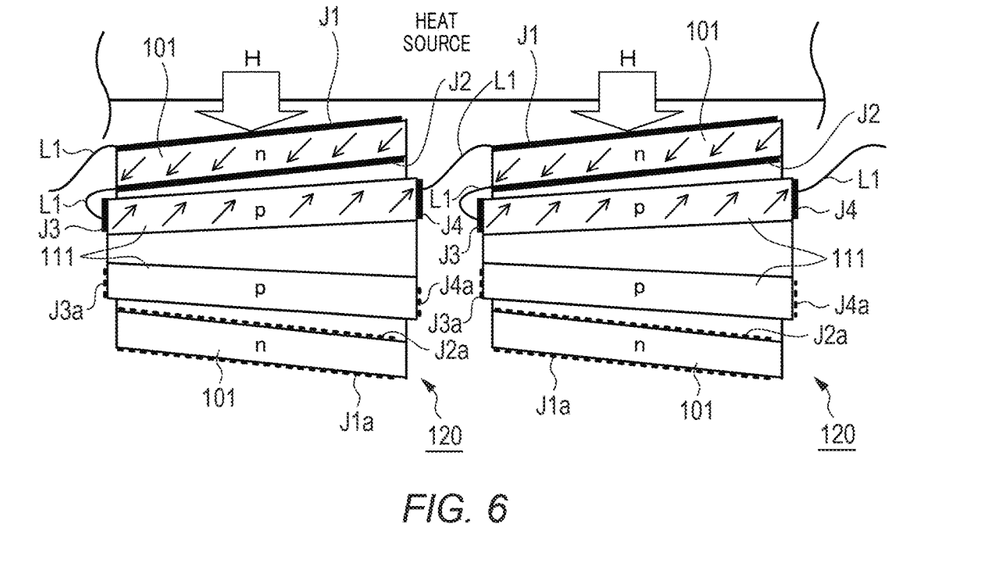
FIG. 6 is a schematic diagram showing one example of connection between two adjacent thermoelectric conversion modules in the thermoelectric conversion apparatus of Embodiment 1.
Figure 7:
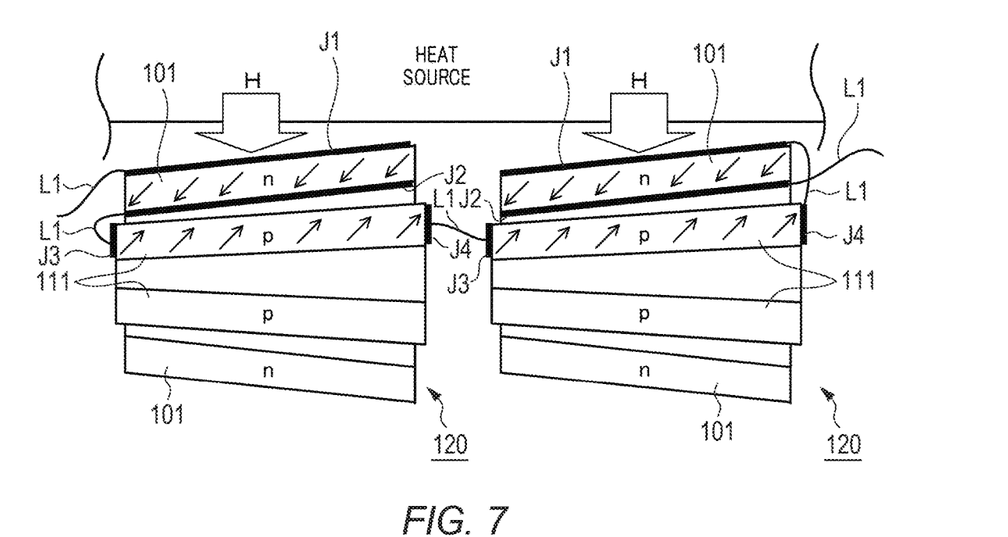
FIG. 7 is a schematic diagram showing one example of connection between two adjacent thermoelectric conversion modules in the thermoelectric conversion apparatus of Embodiment 1.

FIGS. 6 and 7 are schematic diagrams respectively showing one example of connection between two adjacent thermoelectric conversion modules in the thermoelectric conversion apparatus of Embodiment 1.

In FIGS. 6 and 7, the configuration other than thermoelectric conversion materials 101 and 111 and electrodes J1 to J4 in each thermoelectric conversion module 120 is omitted. In addition, when heat is applied, an electromotive force generated in thermoelectric conversion materials 101 and 111 is represented by an arrow.

The electrode configuration of thermoelectric conversion module 120 can be variously changed by a setting of conductive type of thermoelectric conversion materials 101 and 111 (which of p-type and n-type thermoelectric conversion materials is disposed outside and inside) and a current flowing direction.

The examples of FIGS. 6 and 7 are examples with a configuration in which outside thermoelectric conversion material 101 is an n-type material and inside thermoelectric conversion material 111 is a p-type material, and the current flows from the left to the right in the drawing.

In the examples of FIGS. 6 and 7, electrode J1 is provided on the outer circumferential surface of n-type thermoelectric conversion material 101 and electrode J2 is provided on the inner circumferential surface. Moreover, electrode J3 is provided on one end of p-type thermoelectric conversion material 111 in the axial direction and electrode J4 is provided on the other end.

Since electrodes J1 to J4 are provided over the entire circumferential range of thermoelectric conversion module 120 in the circumferential direction, thermoelectric conversion module 120 can have a rotationally symmetrical structure so that thermoelectric conversion module 120 and thermoelectric conversion apparatus 300 can be manufactured at low cost. Moreover, in electrodes J1 to J4, electrodes J1a to J4a in a range distant from the heat source may be omitted and an unnecessary current flowing to thermoelectric conversion materials 101 and 111 in a range distant from the heat source can be avoided by omitting the electrodes so that thermoelectric conversion efficiency can be improved.

In the example in FIG. 6, two electrodes J2 and 33 among four electrodes J1 to J4 are electrically connected each other in one thermoelectric conversion module 120. The connection may be performed by a conductive wire L1 and may be performed using an electrode pattern.

Electrode J1 of front thermoelectric conversion module 120 and electrode J4 of rear thermoelectric conversion module 120 are connected by a conductive wire L1 between two adjacent thermoelectric conversion modules 120 and 120 along the current flowing direction.

That is, in the examples in FIG. 6, each of thermoelectric conversion materials 101 and 111 of plural thermoelectric conversion modules 120 is connected in order of n-type, p-type, n-type and p-type.

Next, power generation operation will be described.

Heat H from the heat source generates a large temperature gradient on a side close to the heat source of thermoelectric conversion module 120. Meanwhile, the temperature gradient is decreased on the side distant from the heat source. Therefore, the electromotive force (represented by an arrow in FIG. 6), which is generated in thermoelectric conversion materials 101 and 111 and close to the heat source, is dominant.

Therefore, according to the connection of electrodes J1 to J4 in FIG. 6, the electromotive force of n-type thermoelectric conversion material 101 and the electromotive force of p-type thermoelectric conversion material 111 are added and voltage in one direction along the module train can be generated.

In the example in FIG. 7, two electrodes J1 and J4 are electrically connected in front (right side in the drawing) thermoelectric conversion module 120 between a pair of two adjacent thermoelectric conversion modules 120 and 120. In addition, two electrodes J2 and J3 are electrically connected in rear (left side in the drawing) thermoelectric conversion module 120.

Furthermore, electrode J3 in front thermoelectric conversion module 120 and electrode J4 in rear thermoelectric conversion module 120 are electrically connected between the pair of two adjacent thermoelectric conversion modules 120 and 120.

On the other hand, in front thermoelectric conversion module 120 of a pair of thermoelectric conversion modules 120 and rear thermoelectric conversion module 120 of another pair of thermoelectric conversion modules 120, electrodes J1 and J2 are electrically connected.

That is, in the example in FIG. 7, each of thermoelectric conversion materials 101 and 111 of plural thermoelectric conversion modules 120 is connected in order of n-type, p-type, p-type and n-type.

Even with the connection, the electromotive force of n-type thermoelectric conversion material 101 and the electromotive force of p-type thermoelectric conversion material 111 are added and voltage in one direction along the module train can be generated.

Effect of Embodiment

As described above, according to thermoelectric conversion apparatus 300 of Embodiment 1, irrespective of the heat source shape, plural thermoelectric conversion modules 120 can be flexibly attached to the heat source. In addition, n-type thermoelectric conversion material 101 and p-type thermoelectric conversion material 111 approach the heat source in high density at the time of installation. Therefore, by effectively using heat, highly efficient power generation can be performed.

Embodiment 2

Figure 8:
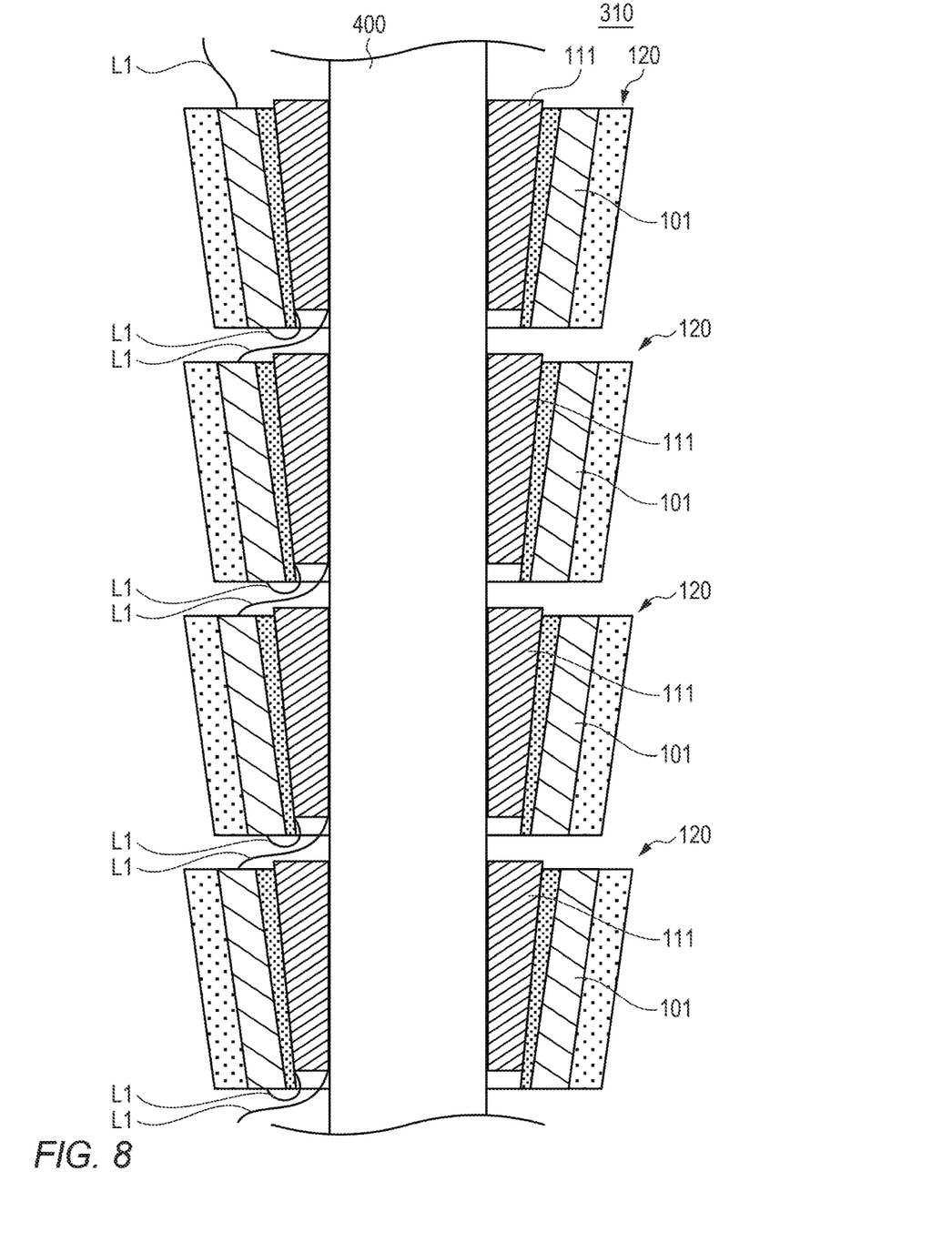
FIG. 8 is a diagram showing a thermoelectric conversion apparatus according to Embodiment 2 of the present invention.

FIG. 8 is a configuration diagram showing a thermoelectric conversion apparatus according to Embodiment 2 of the present invention. In FIG. 8, a vertical cross-sectional view of each thermoelectric conversion module 120 is shown.

Thermoelectric conversion apparatus 310 of Embodiment 2 has a configuration in which pipe 400 which is a heat source passes through hollow portions of plural thermoelectric conversion modules 120 and plural thermoelectric conversion modules 120 are sequentially and electrically connected.

In thermoelectric conversion module 120 of Embodiment 2, hollow portion of thermoelectric conversion material 111 has the almost same diameter as the diameter of the pipe 400 and does not have a tapered shape. Due to this, thermoelectric conversion material 111 is in close contact with the pipe 400 and the heat of pipe 400 can be effectively transmitted to thermoelectric conversion material 111.

The hollow portion of thermoelectric conversion material 111 may have a larger outer diameter than the diameter of pipe 400. In addition, the hollow portion of thermoelectric conversion material 111 may have a tapered shape. In these cases, while a portion where the inner surface of thermoelectric conversion material 111 and the outer surface of pipe 400 are separated is generated, the portion may be filled with a material having a thermal conductivity. In the configuration, the heat of pipe 400 can be effectively transmitted to thermoelectric conversion material 111.

The examples in FIGS. 6 and 7 can be applied as for the position and connection configuration of the electrode of thermoelectric conversion module 120. However, the heat from pipe 400 is transmitted to the entire circumferential range of thermoelectric conversion module 120 in the circumferential direction in Embodiment 2. Therefore, electrodes J1 to J4 may be provided over the entire circumference of thermoelectric conversion materials 101 and 111 in the circumferential direction.

According to the configuration, the electromotive forces are generated due to the heat from pipe 400 in the entire region of thermoelectric conversion materials 101 and 111 of thermoelectric conversion module 120. Then, these electromotive forces are added and voltage in one direction along the module train can be generated.

As described above, according to thermoelectric conversion apparatus 310 of Embodiment 2, n-type thermoelectric conversion material 101 and p-type thermoelectric conversion material 111 can be provided to a rod-like heat source in high density so that highly efficient power generation can be performed.

Each Embodiment of the present invention is described above.

In the above embodiment, the configuration in which thermoelectric conversion material 101 disposed outside of thermoelectric conversion module is the n-type thermoelectric conversion material, and thermoelectric conversion material 111 disposed inside is the p-type thermoelectric conversion material is described as an example. However, these conductive types may be reversed.

In addition, the configuration in which both thermoelectric conversion materials 101 and 111 has a tapered shape is described as an example in the above embodiment. Moreover, the configuration in which a tapered shape is provide on both the outer circumferential surface and inner circumferential surface of thermoelectric conversion materials 101 and 111 is described as an example. However, a configuration in which both thermoelectric conversion materials 101 and 111 do not have a tapered shape may be employed. The taper may be provided only one of thermoelectric conversion materials 101 and 111 and may be provided only one of the outer circumferential surface and inner circumferential surface.

In addition, the configuration in which two thermoelectric conversion materials 101 and 111 are joined through junction portion 112 is described as an example in the above embodiment. However, the junction portion 112 may not be provided and for example, two thermoelectric conversion materials 101 and 111 may be joined by direct contact.

Furthermore, a continuous structure of plural thermoelectric conversion modules, and the position and coupled configuration of the electrode are not limited to the examples described in detail in the embodiment and can be changed in various manners.

INDUSTRIAL APPLICABILITY

The present invention is suitable for use in the thermoelectric conversion apparatus which converts heat into electricity and the thermoelectric conversion module.

REFERENCE SIGNS LIST 100,110,110A Thermoelectric conversion element
101 Thermoelectric conversion material (n-type)
102 Heat-resistant insulating material
103 Hollow portion
111, 111A Thermoelectric conversion material (p-type)
112 Junction portion
113 Hollow portion
120, 120A Thermoelectric conversion module
300, 310 Thermoelectric conversion apparatus
400 Pipe (heat source)
J1 to J4 Electrode

The invention claimed is:
1. A thermoelectric conversion apparatus comprising:
a plurality of thermoelectric conversion modules, each of the thermoelectric conversion modules including:
a first thermoelectric conversion element configured of a cylindrical thermoelectric conversion material having a hollow portion in an axial direction thereof; and a second thermoelectric conversion element configured of a thermoelectric conversion material having a different conductive type from that of the first thermoelectric conversion element and fixed in the hollow portion;

wherein one end and another end of the second thermoelectric conversion element in the axial direction protrude from respective corresponding ends of the first thermoelectric conversion element;

the second thermoelectric conversion element is configured with a tapered thermoelectric conversion material;

the second thermoelectric conversion element extends along a length greater than the first thermoelectric conversion element; and wherein the plurality of thermoelectric conversion modules are aligned end-to-end in the axial direction in at least two rows on a flexible belt body.

2. The thermoelectric conversion apparatus according to claim 1, wherein:

the second thermoelectric conversion element is hollow cylindrical.

3. The thermoelectric conversion apparatus according to claim 2, wherein:

one of or both the first thermoelectric conversion element and the second thermoelectric conversion element is or are tapered hollow cylindrical.

4. The thermoelectric conversion apparatus according to claim 1, further comprising:

at least a pair of electrodes provided in the first thermoelectric conversion element; and at least a pair of electrodes provided in the second thermoelectric conversion element, wherein at least one of the electrodes provided in the first thermoelectric conversion element and at least one of the electrodes provided in the second thermoelectric conversion element are electrically connected.

5. The thermoelectric conversion apparatus according to claim 1, further comprising a cylindrical heat-resistant insulator, wherein the thermoelectric conversion material of the first thermoelectric conversion element is formed on an inner wall surface of the heat-resistant insulator in a film shape.

6. The thermoelectric conversion apparatus according to claim 1, wherein the flexible belt body substrate is configured to be wrapped around a rod-like heat source.

7. The thermoelectric conversion apparatus according to claim 1, wherein the plurality of thermoelectric conversion modules in each row are electrically connected to each other in series by a conductive material.

* * * * *